US012804324B2

(12) United States Patent
Tan et al.

(10) Patent No.: US 12,804,324 B2
(45) Date of Patent: Nov. 17, 2026

(54) MEMS DEVICE AND METHOD FOR MANUFACTURING THE SAME

(71) Applicant: AAC Technologies Pte. Ltd., Singapore (SG)

(72) Inventors: Chun Pheng Tan, Singapore (SG); Anup Patel, EB (GB); Kahkeen Lai, Singapore (SG); Rui Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 301 days.

(21) Appl. No.: 18/427,760

(22) Filed: Jan. 30, 2024

(65) Prior Publication Data

US 2025/0247651 A1 Jul. 31, 2025

(51) Int. Cl.

| | |
|---|---|
| ***H04R 7/06*** | (2006.01) |
| ***B81B 3/00*** | (2006.01) |
| ***B81C 1/00*** | (2006.01) |
| ***H04R 7/18*** | (2006.01) |
| ***H04R 19/04*** | (2006.01) |
| ***H04R 31/00*** | (2006.01) |

(52) U.S. Cl.

CPC ............... *H04R 7/06* (2013.01); *B81B 3/007* (2013.01); *B81C 1/00658* (2013.01); *H04R 7/18* (2013.01); *H04R 19/04* (2013.01); *H04R 31/003* (2013.01); *B81B 2201/0257* (2013.01); *B81B 2203/0127* (2013.01); *B81B 2203/04* (2013.01); *H04R 2201/003* (2013.01)

(58) Field of Classification Search

CPC ...... H04R 2201/003; H04R 7/06; H04R 7/18; H04R 7/16; H04R 19/00; H04R 19/005; H04R 19/04; B81B 3/007

See application file for complete search history.

(56) References Cited

U.S. PATENT DOCUMENTS

| | | | | |
|---|---|---|---|---|
| 2019/0071305 | A1* | 3/2019 | Strasser | B81B 7/02 |
| 2023/0388711 | A1* | 11/2023 | Boyd | H04R 7/06 |

* cited by examiner

*Primary Examiner* — Sunita Joshi

(74) *Attorney, Agent, or Firm* — Wiersch Law Group

(57) ABSTRACT

MEMS device and manufacturing method therefor. The device includes a base; a diaphragm including an upper part and a lower part, a receiving space being formed therebetween; a counter electrode located in the receiving space; and support members located between the two parts, spaced apart from one another and from the counter electrode, two ends of each support member being connected to the two parts, respectively. The diaphragm includes a first zone and a second zone. In the first zone, a surface of the upper part is covered with a first electrode, a surface of the lower part is covered with a second electrode opposite to the first electrode. In the second zone, a surface of the upper part and a surface of the lower part are each covered with a reinforcement layer. The reinforcement layer in the second zone enhances the mechanical strength and robustness of the diaphragm.

8 Claims, 3 Drawing Sheets

MEMS DEVICE AND METHOD FOR MANUFACTURING THE SAME

TECHNICAL FIELD

The present disclosure relates to the technical field of microelectromechanical systems, and in particular, to a MEMS device and a manufacturing method for the MEMS device.

BACKGROUND

In the prior art, a dual-diaphragm microphone having two diaphragms at opposite sides of a counter electrode has been developed and produced. In this case, a receiving space that can be sealed between the two diaphragms is then formed, and it can have different pressures against the external environment. The top and bottom diaphragms are formed a double-layer dielectric nitride layer and a polysilicon layer, with the nitride layer serving as the diaphragm and the polysilicon serving as the conductive electrode. The electrode area is usually smaller in diameter than the diaphragm in order to enhance sensitivity. There will be a connecting wall structure that act as a support member between the two diaphragms. An air gap cavity is formed at the support member, and the air gap cavity cannot withstand a mechanical force acting on the diaphragm, causing the diaphragm to break.

SUMMARY

A purpose of the present disclosure is to provide a MEMS device and a method for manufacturing the MEMS device, to solve the technical problems in the prior art.

In an aspect, an embodiment of the present disclosure provides a MEMS device, including: a base, a back cavity passing through the base; a diaphragm connected to the base and covering the back cavity, the diaphragm including an upper diaphragm part and a lower diaphragm part that are arranged opposite to each other, and a receiving space being formed between the upper diaphragm part and the lower diaphragm part; a counter electrode located in the receiving space; and support members arranged concentrically and located between the upper diaphragm part and the lower diaphragm part, the support members being spaced apart from one another and spaced apart from the counter electrode, two opposite ends of each of the support members being connected to the upper diaphragm part and the lower diaphragm part, respectively. The diaphragm includes a first zone and a second zone located at an outer circumference of the first zone. In the first zone, a surface of the upper diaphragm part facing away from the lower diaphragm part is covered with a first electrode, a surface of the lower diaphragm part facing away from the upper diaphragm part is covered with a second electrode, and the first electrode is arranged opposite to the second electrode. In the second zone, a surface of the upper diaphragm part facing away from the lower diaphragm part and a surface of the lower diaphragm part facing away from the upper diaphragm part are each covered with a reinforcement layer.

As an improvement, in the second zone, first cavities are formed in one of the support members. An upper ventilation slot penetrating through the upper diaphragm part is formed corresponding to the first cavities, and a lower ventilation slot penetrating through the lower diaphragm part is formed corresponding to the first cavities. The upper ventilation slot, the first cavities and the lower ventilation slot are connected.

As an improvement, the first cavities are only formed in the support member located at a periphery of the diaphragm.

As an improvement, the upper diaphragm part includes first protrusions protruding toward the receiving space and spaced apart from one another, and the lower diaphragm part includes second protrusions protruding toward the receiving space and spaced apart from one another. The support members, the first protrusions and the second protrusions all correspond to each other. Two ends of the support member are connected to the first protrusion and the second protrusion, respectively. The upper ventilation slot is formed at the first protrusion, and the lower ventilation slot is formed at the second protrusion.

As an improvement, a surface of the upper diaphragm part, a surface of the lower diaphragm part, an inner wall surface of the first protrusion and an inner wall surface of the second protrusion are each covered with a reinforcement layer.

As an improvement, the reinforcement layer only covers a surface of the upper diaphragm part and a surface of the lower diaphragm part.

As an improvement, the reinforcement layer is made of a conductive material, the reinforcement layer is electrically connected to the counter electrode, and the reinforcement layer and the counter electrode have a same potential.

As an improvement, the reinforcement layer is made of an insulating material.

In another aspect, an embodiment of the present disclosure provides a method for manufacturing the MEMS device as described above, and the method includes: forming an upper diaphragm part or a lower diaphragm part, the upper diaphragm part or the lower diaphragm part being formed with a first zone and a second zone; depositing a deposit layer on the upper diaphragm part or the lower diaphragm part; injecting plasma to the deposit layer at the first zone and the second zone; annealing; and etching the deposit layer to form an isolation groove located at a junction of the first zone and the second zone.

In another aspect, an embodiment of the present disclosure provides a method for manufacturing the MEMS device as described above, and the method includes: forming an upper diaphragm part or a lower diaphragm part, the upper diaphragm part or the lower diaphragm part being formed with a first zone and a second zone; depositing a deposit layer on the upper diaphragm part or the lower diaphragm part; injecting plasma to the deposit layer at the first zone; annealing; and etching the deposit layer to form an isolation groove located at a junction of the first zone and the second zone.

Compared with the prior art, the present disclosure provides a reinforcement layer in the second zone of the diaphragm, and the reinforcement layer can enhance the mechanical strength and robustness of the diaphragm and improve the yield of the manufacturing process.

REFERENCE SIGNS

10—base, 11—back cavity;
20—diaphragm, 21—upper diaphragm part, 211—upper ventilation slot, 22—lower diaphragm part, 221—lower ventilation slot, 23—receiving space, 24—first protrusion, 25—second protrusion;
30—support member, 31—first cavity;
40—counter electrode;
50—first electrode;
60—second electrode;
70—reinforcement layer;
80—deposit layer;
Z1—first zone;
Z2—second zone.

DESCRIPTION OF EMBODIMENTS

The embodiments of the present disclosure are described in detail below, examples of which are illustrated in the accompanying drawings. Throughout, the same or similar reference signs represent the same or similar elements or elements with the same or similar functions. The embodiments described below with reference to the accompanying drawings are exemplary and are only used to explain the present disclosure and shall be construed as limiting the present disclosure.

Figure 1:
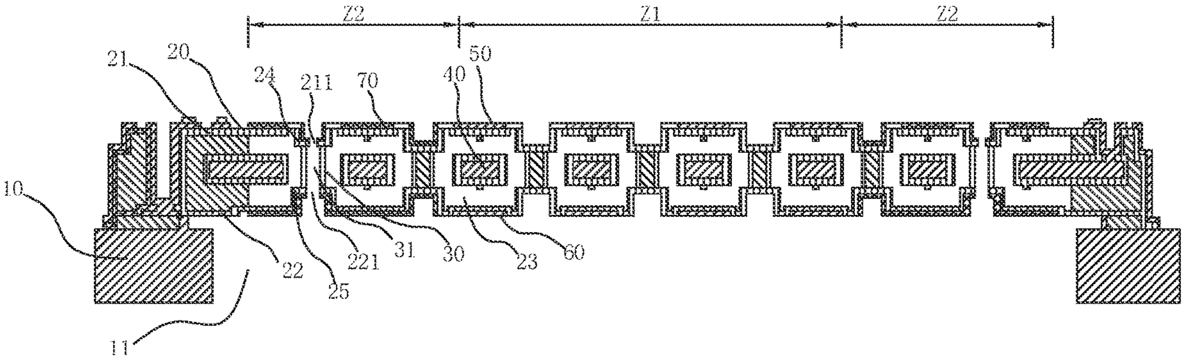
FIG. 1 is a schematic structural diagram of a MEMS device having a first structure according to an embodiment of the present disclosure.
Figure 2:
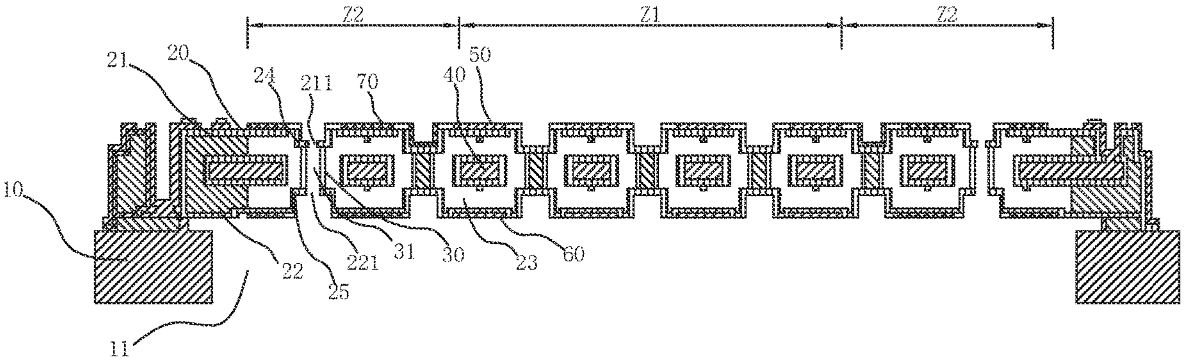
FIG. 2 is a schematic structural diagram of a MEMS device having a second structure according to an embodiment of the present disclosure.

With reference to FIG. 1 and FIG. 2, an embodiment of the present disclosure provides a MEMS device, including a base 10, a diaphragm 20, a counter electrode 40 and a support member 30.

A back cavity 11 passes through the base 10. In an example, an inner contour of the back cavity 11 is a circular groove structure.

The diaphragm 20 is connected to the base 10 and covers the back cavity 11. The diaphragm 20 includes an upper diaphragm part 21 and a lower diaphragm part 22 that are arranged opposite to each other. In an embodiment, the upper diaphragm part 21 and the lower diaphragm part 22 are concentrically arranged circular structures. A preset gap is formed between the upper diaphragm part 21 and the lower diaphragm part 22 to form a receiving space 23. The lower diaphragm part 22 is disposed below the upper diaphragm part 21.

In an example, the receiving space 23 is hermetically sealed, and an internal pressure of the receiving space 23 is less than the external atmospheric pressure. The internal pressure of the receiving space 23 is less than 0.2 atm. For example, the internal pressure of the receiving space 23 is equal to 0.1 atm. In some embodiments, the receiving space 23 is filled with vacuum.

The counter electrode 40 is provided in the receiving space 23 in a suspended state. Under normal conditions, there is no contact between the counter electrode 40 and the upper diaphragm part 21 and between the counter electrode 40 and the lower diaphragm part 22, and there is no mechanical coupling between the counter electrode 40 and the support member 30.

In some embodiments of the present disclosure, the diaphragm 20 includes a first zone Z1 and a second zone Z2, and the second zone Z2 is located at an outer circumference of the first zone Z1. The first zone Z1 and the second zone Z2 are artificially defined and can be modified in shapes and coverage ranges according to actual product requirements. The first zone Z1 is located at a center of the diaphragm 20, and the second zone Z2 is located at an edge of the diaphragm 20. The first zone Z1 may be a circular structure, and the second zone Z2 may be an annular structure. An inner annular surface of the annular structure is continuous with an outer annular surface of the circular structure.

With reference to FIG. 1 and FIG. 2, in the first zone Z1, a surface of the upper diaphragm part 21 facing away from the lower diaphragm part 22 is covered with a first electrode 50, and a surface of the lower diaphragm part 22 facing away from the upper diaphragm part 21 is covered with a second electrode 60 arranged opposite to the first electrode 50.

In the first zone Z1, a first capacitance is formed between the first electrode 50 and the counter electrode 40, and a second capacitance is formed between the second electrode 60 and the counter electrode 40. In response to a pressure applied to the upper diaphragm part 21 and the lower diaphragm part 22, the upper diaphragm part 21 and the lower diaphragm part 22 are movable relative to the corresponding counter electrode 40, thereby changing a distance between the first electrode 50 and the second electrode 60 and the corresponding counter electrode 40. As a result, the capacitance changes, and an electrical signal is output accordingly.

Further, in the second zone Z2, a surface of the upper diaphragm part 21 facing away from the lower diaphragm part 22 and a surface of the lower diaphragm part 22 facing away from the upper diaphragm part 21 are each covered with a reinforcement layer 70.

In some embodiments of the present disclosure, since the second zone Z2 is located at the edge of the diaphragm 20, the stress concentration and deflection of the diaphragm 20 are the highest at this position. By covering the second zone Z2 with the reinforcement layer 70, the mechanical strength of the diaphragm 20 in the second zone Z2 can be enhanced, so that the diaphragm 20 can withstand a greater mechanical force, thereby preventing the diaphragm 20 from breaking.

A plurality of support members 30 are concentrically arranged in the receiving space 23, and each of the plurality of support members 30 is spaced apart from the counter electrode 40. The plurality of support members 30 are spaced apart from one another along a radial direction of the diaphragm 20 with a center of a circle of the diaphragm 20 being as a center. For at least one of the plurality of support members 30, several first cavities 31 are formed in the support member 30, for example, several first cavities 31 are only formed in the support member 30 that is located at a periphery of the diaphragm 20. In a partial area of the support member 30, two opposite ends of the support member 30 are connected to the upper diaphragm part 21 and the lower diaphragm part 22, respectively.

The function of the support member 30 is to keep the upper diaphragm part 21 and the lower diaphragm part 22 flat, or at least limit/control the bending/deformation of the upper diaphragm part 21 and lower diaphragm part 22 within a height range of the support member 30, to avoid a case that the upper diaphragm part 21 and the lower diaphragm part 22 fold with each other when a volume sealed in the receiving space 23 is at the reduced atmospheric pressure while the outside is at the ambient atmospheric pressure.

With reference to FIG. 1 and FIG. 2, the MEMS device includes an upper ventilation slot 211 penetrating through the upper diaphragm part 21 corresponding to the first cavity 31, and a lower ventilation slot 221 penetrating through the lower diaphragm part 22 corresponding to the first cavity 31.

The upper ventilation slot 211 and the lower ventilation slot 221 are connected by the first cavity 31 to form a ventilation channel. Compared with a solution where the ventilation channel is arranged at a center of the diaphragm 20, this embodiment of the present disclosure will not reduce a local stiffness of the diaphragm 20 while improving the flexibility of the diaphragm 20.

Controlling the acoustic resistance through openings in the upper diaphragm part 21 or the lower diaphragm part 22 allows for shallower, more controlled etching to control the acoustic resistance. This allows etching and lithography to be performed on a more uniform topology, thereby simplifying the process and reducing variability.

The first cavity 31 is arranged in the support member 30 to ensure that the local stiffness at the arrangement zone is not changed, while ensuring that the edges of the upper ventilation slot 211, the first cavity 31 and the lower ventilation slot 221 are mechanically supported. It prevents the problem that the upper ventilation slot 211, the first cavity 31 and the lower ventilation slot 221 opens due to the inherent stress in the diaphragm 20, to cause the sound resistance to deviate from a design value.

Further, the upper ventilation slot 211 and the lower ventilation slot 221 are close to the edge of the diaphragm 20. Each of the upper ventilation slot 211 and the lower ventilation slot 221 may be a slit-shaped slot, whose length is much longer than the width. In this way, it prevents the problem that the slit opens due to inherent stress inside the diaphragm, to cause the acoustic resistance to deviate from a design value.

With reference to FIG. 1 and FIG. 2, each of the upper diaphragm part 21 and the lower diaphragm part 22 has a corrugated structure, and is made of a conductive material, or is an insulating film including a conductive material or including a conductive region formed by material doping or injection. The upper diaphragm part 21 includes first protrusions 24 protruding toward the receiving space 23 and spaced apart from one another, and the lower diaphragm part 22 includes second protrusions 25 protruding toward the receiving space 23 and spaced apart from one another. The first protrusions 24 are arranged along a radial direction of the diaphragm 20 and are spaced apart from one another, and the second protrusions 25 arranged along a radial direction of the diaphragm 20 and are spaced apart from one another. The support members 30, the first protrusions 24 and the second protrusions 25 correspond one to one, respectively. Two ends of the support member 30 are connected to the first protrusion 24 and the second protrusion 25, respectively. The upper ventilation slot 211 is formed at the first protrusion 24, and the lower ventilation slot 221 is formed at the second protrusion 25.

In an example, the shape and size of the first protrusion 24 and the second protrusion 25 are the same to form regular corrugations, so that the stress on the entire diaphragm 20 is evenly distributed, and at the same time it is convenient for the forming processing. Meanwhile, a cross-sectional shape of each of the first protrusion 24 and the second protrusion 25 in a direction perpendicular to the diaphragm 20 may be rectangular, trapezoidal or triangular, etc., and an angle of an inclined surface of the first protrusion 24 and the second protrusion 25 may be greater than 0° and less than or equal to 90°. Those skilled in the art should know that the cross-sectional shapes of the first protrusion 24 and the second protrusion 25 in the direction perpendicular to the diaphragm 20 may be regular shapes or irregular shapes, which are not limited herein.

The first protrusion 24 and the second protrusion 25 together form the corrugation of the diaphragm 20, so that the diaphragm 20 has greater tension and can withstand greater sound pressure. At the same time, the diaphragm 20 has less internal stress, and the stiffness of the diaphragm 20 is reduced, effectively improving the mechanical sensitivity of the MEMS device.

With reference to FIG. 1, a surface of the upper diaphragm part 21, a surface of the lower diaphragm part 22, an inner wall surface of the first protrusion 24 and an inner wall surface of the second protrusion 25 are each covered with the reinforcement layer 70. The reinforcement layer 70 is a diaphragm structure, which can effectively improve the structural stability of the second zone Z2, thereby further reducing a risk of mechanical damage.

With reference to FIG. 2, the reinforcement layer 70 only covers the surfaces of the upper diaphragm part 21 and the lower diaphragm part 22, and the inner wall surfaces of the first protrusion 24 and the second protrusion 25 are not covered with the reinforcement layer 70. In this way, it can improve the mechanical strength of the diaphragm 20 while maintaining the flexibility and sensitivity of the diaphragm 20.

In an embodiment, the reinforcement layer 70 is made of a conductive material, which may be the same as the first electrode 50 or the second electrode 60. The reinforcement layer 70 is electrically connected to the counter electrode 40. The reinforcement layer 70 and the counter electrode 40 have a same potential. The reinforcement layer 70 will not act as an electrode that may change the capacitance sensing zone. Although a distance between the reinforcement layer 70 and the counter electrode 40 will change according to the external pressure, it will not cause a change in capacitance and will not output an electrical signal.

Figure 3:
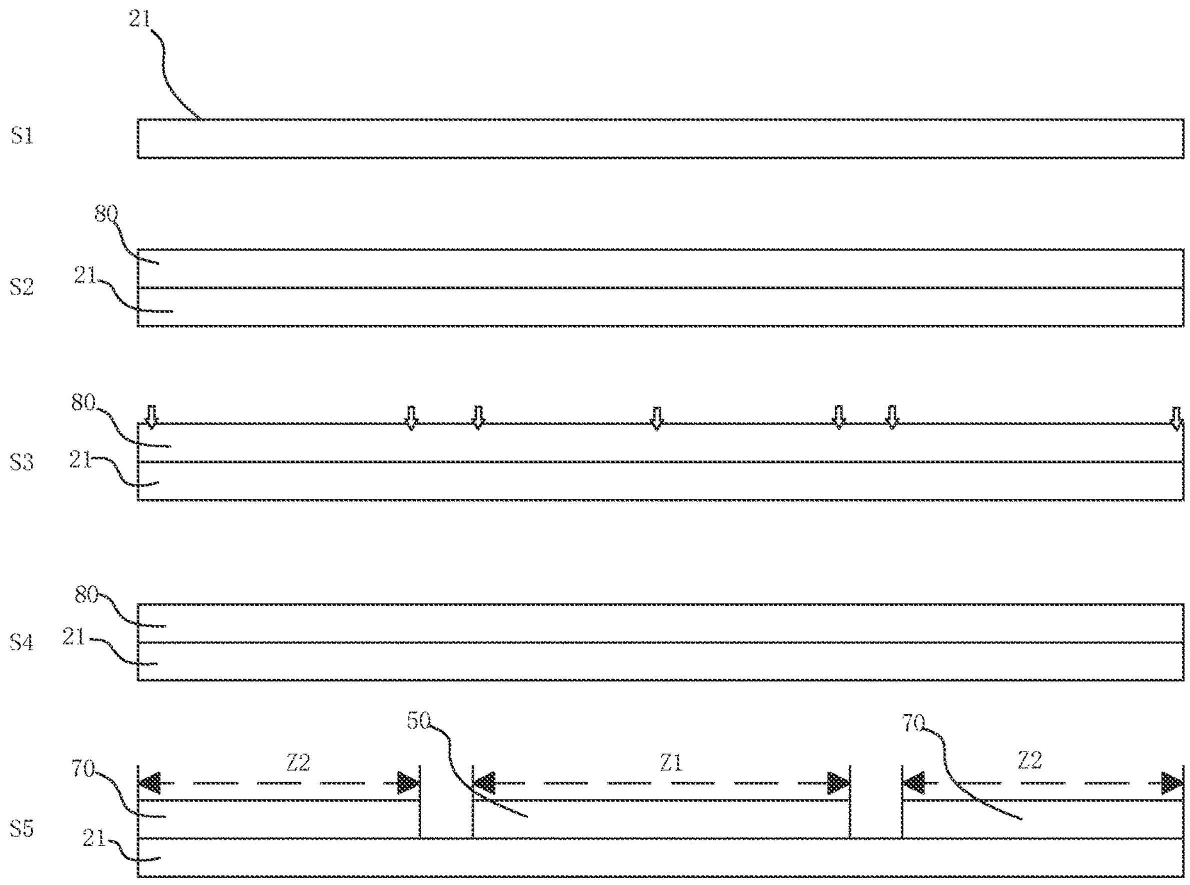
FIG. 3 illustrates a first method for manufacturing a reinforcement layer according to an embodiment of the present disclosure.

With reference to FIG. 3, an embodiment of the present disclosure provides a method for manufacturing the reinforcement layer 70 of a conductive material, and the method includes the following steps.

At step S1, an upper diaphragm part 21 or a lower diaphragm part 22 is formed, and the upper diaphragm part 21 or the lower diaphragm part 22 is preset with a first zone Z1 and a second zone Z2.

At step S2, a deposit layer is formed on the upper diaphragm part 21 or the lower diaphragm part 22 to form a deposit layer 80.

At step S3, plasma is inserted into the deposit layer 80 at the first zone Z1 and the second zone Z2.

At step S4, annealing is performed.

At step S5, the deposit layer 80 is etched to form an isolation groove. The isolation groove is located at a junction of the first zone Z1 and the second zone Z2. In an embodiment, the isolation groove is an annular groove, and a part of the deposit layer 80 located inside the annular groove forms the first electrode 50 or the second electrode 60, while another part of the deposit layer 80 located outside the annular groove forms the reinforcement layer 70. Further, the reinforcement layer 70 is electrically connected to the counter electrode 40. The reinforcement layer 70 and the counter electrode 40 have a same potential, and the reinforcement layer 70 does not act as an electrode that may change the capacitance sensing zone.

In another embodiment, the reinforcement layer 70 is made of an insulating material and is non-conductive, so the reinforcement layer 70 does not need to be electrically connected to the counter electrode 40 and does not act as an electrode that may change the capacitance sensing zone.

Figure 4:
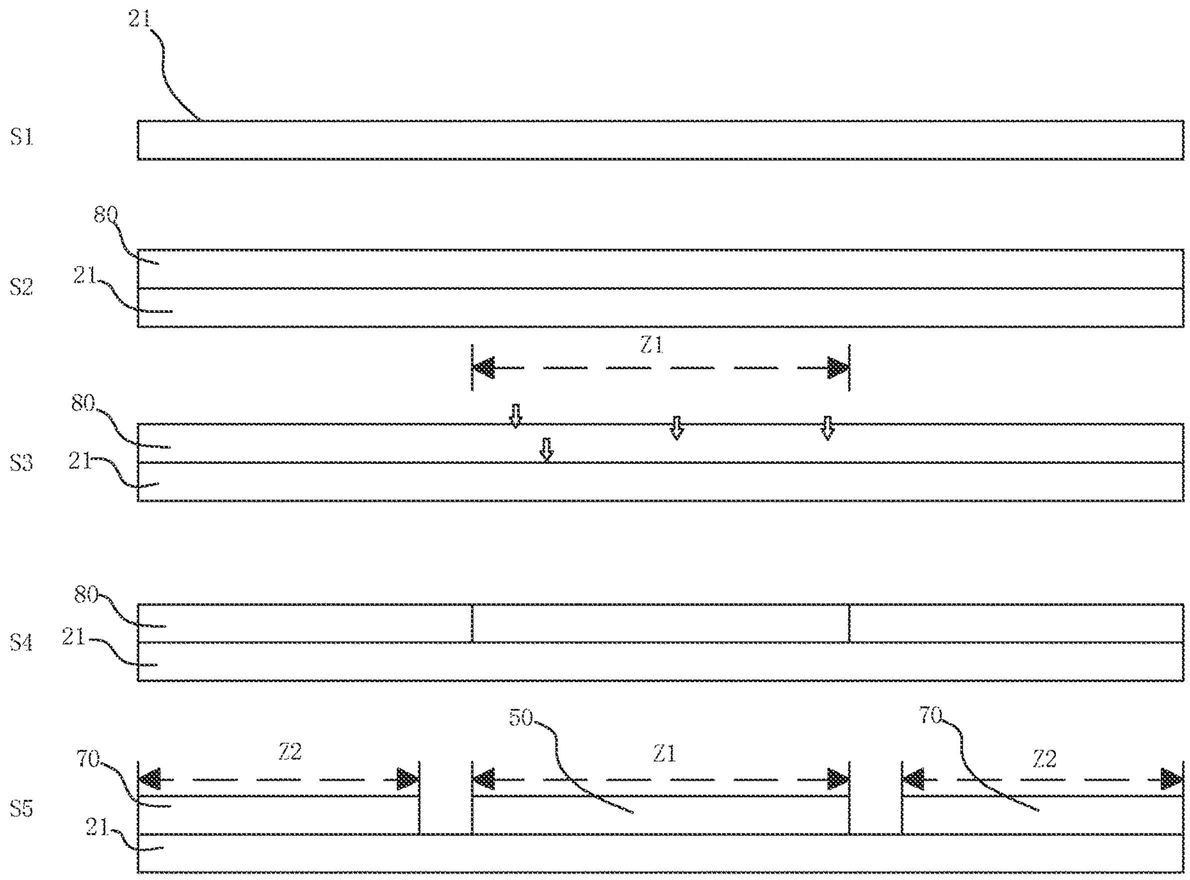
FIG. 4 illustrates a second method for manufacturing a reinforcement layer according to an embodiment of the present disclosure.

With reference to FIG. 4, the method for manufacturing the reinforcement layer 70 of the insulating material includes the following steps.

At step S1, an upper diaphragm part 21 or a lower diaphragm part 22 is formed, and the upper diaphragm part 21 or the lower diaphragm part 22 is preset with the first zone Z1 and the second zone Z2.

At step S2, a deposit layer 80 is deposited on the upper diaphragm part 21 or the lower diaphragm part 22.

At step S3, plasma is injected to form the first electrode 50 or the second electrode 60 at the first zone Z1, and no plasma is injected at the first zone Z1.

At step S4, annealing is performed.

At step S5, the deposit layer 80 is etched to form an isolation groove. The isolation groove is located at a junction of the first zone Z1 and the second zone Z2. In an embodiment, the isolation groove is an annular groove, and a part of the deposit layer 80 located inside the annular groove forms the first electrode 50 or the second electrode 60, while another part of the deposit layer 80 located outside the annular groove forms the reinforcement layer 70. Since no plasma is injected to the deposit layer 80 at the second zone Z2, it is not conductive and does not change the capacitance sensing zone. The reinforcement layer 70 does not need to be connected to the counter electrode 40, thereby providing greater flexibility in the structural design.

The structure, features and effects of the present disclosure have been described in detail based on the embodiments shown in the drawings. The above descriptions are only preferred embodiments of the present disclosure. However, the scope of the present disclosure is not limited by the drawings. Any changes or modifications made within a concept of the present disclosure shall fall within a scope of the present disclosure.

What is claimed is:

1. A MEMS device, comprising:

a base, wherein a back cavity passes through the base;

a diaphragm connected to the base and covering the back cavity, wherein the diaphragm comprises an upper diaphragm part and a lower diaphragm part that are arranged opposite to each other, and a receiving space is formed between the upper diaphragm part and the lower diaphragm part;

a counter electrode located in the receiving space; and support members arranged concentrically and located between the upper diaphragm part and the lower diaphragm part, wherein the support members are spaced apart from one another and spaced apart from the counter electrode, two opposite ends of each of the support members are connected to the upper diaphragm part and the lower diaphragm part, respectively, wherein the diaphragm comprises a first zone and a second zone located at an outer circumference of the first zone, and in the first zone, a surface of the upper diaphragm part facing away from the lower diaphragm part is covered with a first electrode, a surface of the lower diaphragm part facing away from the upper diaphragm part is covered with a second electrode, and the first electrode is arranged opposite to the second electrode, and in the second zone, a surface of the upper diaphragm part facing away from the lower diaphragm part and a surface of the lower diaphragm part facing away from the upper diaphragm part are each covered with a reinforcement layer;

in the second zone, first cavities are formed in one of the support members;

an upper ventilation slot penetrating through the upper diaphragm part is formed corresponding to the first cavities, and a lower ventilation slot penetrating through the lower diaphragm part is formed corresponding to the first cavities; and the upper ventilation slot, the first cavities and the lower ventilation slot are connected;

the first cavities are only formed in the support member located at a periphery of the diaphragm.

2. The MEMS device as described in claim 1, wherein the upper diaphragm part comprises first protrusions protruding toward the receiving space and spaced apart from one another, and the lower diaphragm part comprises second protrusions protruding toward the receiving space and spaced apart from one another;

wherein the support members, the first protrusions and the second protrusions all correspond to each other;

wherein two ends of the support member are connected to the first protrusion and the second protrusion, respectively; and wherein the upper ventilation slot is formed at the first protrusion, and the lower ventilation slot is formed at the second protrusion.

3. The MEMS device as described in claim 2, wherein a surface of the upper diaphragm part, a surface of the lower diaphragm part, an inner wall surface of the first protrusion and an inner wall surface of the second protrusion are each covered with a reinforcement layer.

4. The MEMS device as described in claim 2, wherein the reinforcement layer only covers a surface of the upper diaphragm part and a surface of the lower diaphragm part.

5. The MEMS device as described in claim 1, wherein the reinforcement layer is made of a conductive material, the reinforcement layer is electrically connected to the counter electrode, and the reinforcement layer and the counter electrode have a same potential.

6. The MEMS device as described in claim 1, wherein the reinforcement layer is made of an insulating material.

7. A method for manufacturing the MEMS device as described in claim 1, and the method comprises:

forming an upper diaphragm part or a lower diaphragm part, the upper diaphragm part or the lower diaphragm part being formed with a first zone and a second zone;

depositing a deposit layer on the upper diaphragm part or the lower diaphragm part;

injecting plasma to the deposit layer at the first zone and the second zone;

annealing; and etching the deposit layer to form an isolation groove located at a junction of the first zone and the second zone.

8. A method for manufacturing the MEMS device as described in claim 1, and the method comprises:

forming an upper diaphragm part or a lower diaphragm part, the upper diaphragm part or the lower diaphragm part being formed with a first zone and a second zone;

depositing a deposit layer on the upper diaphragm part or the lower diaphragm part;

injecting plasma to the deposit layer at the first zone;

annealing; and etching the deposit layer to form an isolation groove located at a junction of the first zone and the second zone.

* * * * *